United States Patent [19]

Arai

[11] Patent Number: 4,863,789

[45] Date of Patent: Sep. 5, 1989

[54] ELECTROMAGNETIC WAVE SHIELDING LAMINATE

[75] Inventor: Michio Arai, Jyoyo, Japan

[73] Assignee: Toyo Bussan Kabushiki Kaisha, Tokyo, Japan

[21] Appl. No.: 141,066

[22] Filed: Dec. 29, 1987

[30] Foreign Application Priority Data

Oct. 11, 1987 [JP] Japan .............................. 62-17064[U]

[51] Int. Cl.⁴ .............................................. H05K 9/00
[52] U.S. Cl. .................................. 428/253; 174/35 R; 174/35 MS; 428/256; 428/343; 428/461
[58] Field of Search ............... 428/253, 256, 343, 461; 174/35 MS, 35 GC, 35 R

[56] References Cited

U.S. PATENT DOCUMENTS

| | | | |
|---|---|---|---|
| 3,505,144 | 4/1970 | Kilduff et al. | 428/256 |
| 4,435,465 | 3/1984 | Ebneth et al. | 428/253 |
| 4,631,214 | 12/1986 | Hasegawai | 428/256 |
| 4,678,699 | 7/1987 | Kritchevsky et al. | 428/253 |
| 4,686,141 | 8/1987 | Burns et al. | 174/35 MS |

FOREIGN PATENT DOCUMENTS 1259774  1/1972  United Kingdom .......... 174/35 MS

*Primary Examiner*—Paul J. Thibodeau
*Attorney, Agent, or Firm*—Rogers & Killeen

[57] ABSTRACT

An electromagnetic wave shielding laminate is composed of a substrate made of a synthetic resin with a knitted small-gauge metal wire buried therein.

7 Claims, 1 Drawing Sheet

ELECTROMAGNETIC WAVE SHIELDING LAMINATE

BACKGROUND OF THE INVENTION

1. Field of the Invention

The present invention relates to a laminate that is capable of shielding electromagnetic waves.

2. Description of the Prior Art

In order to provide a film, sheet or plate of a synthetic resin with an electromagnetic wave shielding ability, it is known to laminate a metal plate or foil that is capable of shielding electromagnetic waves to the film, to form a film or a sheet with a resin and an adhesive that contain metal fine powder or to form a laminate from such films or sheets.

However, the conventional electromagnetic wave shielding laminates have the disadvantage that they can be shaped into only a two-dimensional form owing to the inclusion of the metal thin plate or foil and that they must be cut to assemble a solid such as a container like a box.

If an electromagnetic wave shielding laminate is a one made of a resin containing the metal powder, it can be formed into an electromagnetic wave shielding solid structure by one process. However, it is difficult to provide the electromagnetic wave shielding ability over the entire resultant structure uniformly.

Further, the known electromagnetic wave shielding laminate cannot be made transparent or translucent, owing to the inclusion of the metal foil or the like, and there is a limitation to its application.

SUMMARY OF THE INVENTION

Accordingly, an object of the present invention is to provide an electromagnetic wave shielding laminate which can be shaped into a sheet-like or film-like form or a solid such as a box without forming it from a material containing metal powder that is capable of shielding electromagnetic waves, and which can be made transparent.

These objects can be achieved by providing an electromagnetic wave shielding laminate which comprises a film-like, sheet-like or plate-like substrate made of a suitable synthetic resin, and a knitted small-gauge metal wire made of copper or stainless steel which is buried in the flat-plate like substrate from outer surface thereof.

Burial of the knitted small-gauge metal wire in the flat-plate like substrate provides a substrate having the electromagnetic wave shielding ability.

Since the knitted small-gauge metal wire can be expanded and contracted, a laminate which contains this knitted wire can be bent to form a solid.

BRIEF DESCRIPTION OF THE DRAWINGS

The FIGURE is a cross-sectional view of an electromagnetic wave shielding laminate, showing an embodiment of the present invention.

DESCRIPTION OF THE PREFERRED EMBODIMENT

Figure 1:
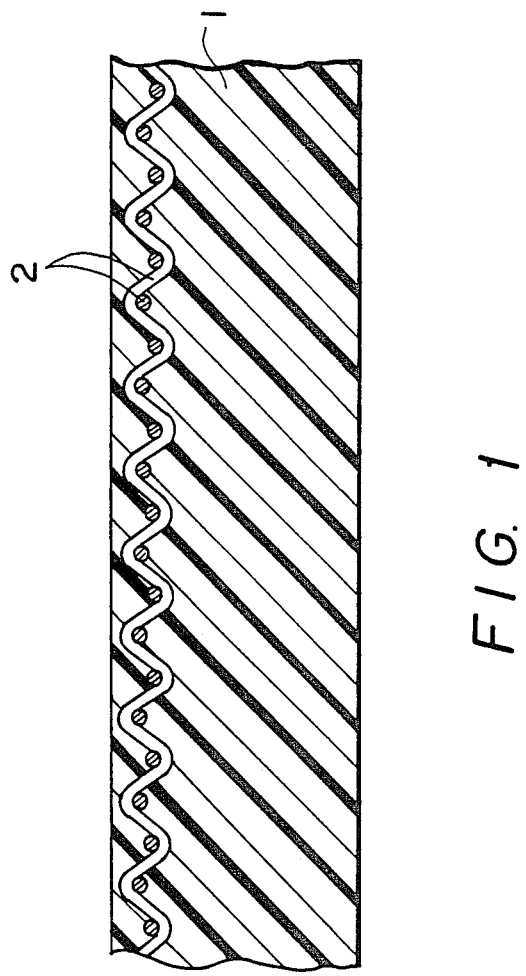

An embodiment of the present invention will now be described in detail with reference to the accompanying sole drawing which is a cross-sectional view of an electromagnetic wave shielding laminate according to the present invention.

A substrate 1 of the electromagnetic wave shielding laminate is made of a flat plate-like synthetic resin, such as a polycarbonate, an acryl, a nylon or a polypropylene, that can be softened and melted by heat. The substrate 1 has a thickness of a few millimeters, if it is in the form of a film. Alternatively, it may have a few centimeters or above, if necessary.

The flat plate-like substrate 1 is provided with a knitted small-gauge metal wire 2 which is buried in the outer surface thereof.

The small gauge metal wire 2 is made of an electrically conductive metal such as copper, brass or stainless steel having a diameter of about 5 to 70 microns. To form a knitted small-gauge metal wire, a small-gauge metal wire and a synthetic resin having a relatively low melting temperature are together supplied to a knitting machine in a state wherein they are intertwined to each other.

If only a very small-gauge metal wire is used to form a knitted metal wire, formation of a knitted metal wire becomes very difficult because of the susceptability of the metal wire being cut.

The knitted small-gauge metal wire with a hot-melt fiber or yarn intertwined therewith is placed on the substrate 1, and the substrate 1 with the knitted small-gauge metal wire 2 is hot-pressed at a temperature at which the substrate 1 is softened and the yarn intertwined with the metal wire is melted.

During hot-pressing, the substrate 1 of the laminate made of the substrate 1 and the knitted metal wire is softened, and the fiber intertwined with the metal wire is melted, so that the knitted metal wire 2 now composed of the remaining metal wire is buried into the substrate 1.

The knitted metal wire may be laminated between glasses of a laminated safety glass, as it is. Alternatively, the substrate 1 with the knitted metal wire buried therein may be laminated in the laminated safety glass. In such cases, the knitted metal wire or the knitted metal wire buried in the substrate 1 may be melted and attached to the surface (to one surface or two) of the glasses.

The electromagnetic wave shielding laminate according to the present invention is not limited to the embodiment described above and may be modified in any of the manners described below: it may have the knitted metal wire 2 buried on the two surfaces of the substrate 1; it may have the small-gauge metal wire 2 buried on one or two surfaces of the substrate 1; it may be a laminate formed by such laminates; it may have a substrate 1 made of an electrically conductive material; it may have an adhesive layer on one surface of the substrate 1; or it may have an elongated, tape-like substrate 1. In any of the above-described laminates, the substrate 1 may be tranparent or opaque.

As will be understood from the foregoing description, since the electromagnetic wave shielding laminate is composed of the flat plate-like substrate with the knitted small-gauge metal wire buried therein by hot-pressing, use of a transparent substrate can make the resultant laminate sufficiently transparent. Such a laminate may be used in place of an electromagnetic wave shielding glass placed in an aperture for admitting light. Further, since the electromagentic wave shielding material in the electromagnetic wave shielding laminate of the present invention, i.e., the knitted metal wire, is expandable, it may be shaped into a three-dimensional form even after it has been formed into a laminate. Regarding the electromagnetic wave shielding laminate with a metal foil, it cannot be shaped into a three-dimensional form once it has been formed into a laminate.

Further, since the laminate according to the present invention is composed of the substrate with the knitted small-gauge metal wire buried therein, the weight thereof can be decreased. Also, it is incombustible, whereas a synthetic resin cloth with an electromagnetic wave shielding material plated thereto is inflammable.

The electromagnetic wave shielding laminate according to the present invention is thus very useful.

What is claimed is:

1. An electromagnetic wave shielding laminate comprising:
    (a) a substrate made of a thermoplastic synthetic resin; and
    (b) a mesh buried in said substrate comprising,
        a solid metal wire having a diameter of from 5 to 70 microns, and
        a synthetic resin fiber intertwined with said wire to form a knitted metal wire,
        said knitted metal wire being arrayed to form said mesh.

2. An electromagnetic wave shielding laminate according to claim 1, wherein said substrate made of a synthetic resin is shaped into a film, sheet or a plate form.

3. An electromagnetic wave shielding laminate according to claim 1, wherein said film or sheet electromagnetic wave shielding laminate has an adhesive layer on one surface thereof.

4. An electromagnetic wave shielding laminate according to claim 2, wherein said electromagnetic wave shielding laminate is shaped into a tape form.

5. An electromagnetic wave shielding laminate according to claim 1, wherein said film or sheet electromagnetic wave shielding laminate has a metal layer on one surface thereof.

6. An electromagnetic wave shielding laminate according to claim 3, wherein said electromagnetic wave shielding laminate is shaped into a tape form.

7. An electromagnetic wave shielding laminate according to claim 4, wherein said film or sheet electromagnetic wave shielding laminate has a metal layer on one surface thereof.

* * * * *